United States Patent
Gerlach et al.

(10) Patent No.: US 10,658,817 B2
(45) Date of Patent: *May 19, 2020

(54) VERTICAL CAVITY SURFACE EMITTING LASER

(71) Applicant: PHILIPS PHOTONICS GMBH, Ulm (DE)

(72) Inventors: Philipp Henning Gerlach, Eindhoven (NL); Roger King, Eindhoven (NL)

(73) Assignee: TRUMPF PHOTONIC COMPONENTS GMBH, Ulm (DE)

(*) Notice: Subject to any disclaimer, the term of this patent is extended or adjusted under 35 U.S.C. 154(b) by 0 days.

This patent is subject to a terminal disclaimer.

(21) Appl. No.: 16/167,644

(22) Filed: Oct. 23, 2018

(65) Prior Publication Data

US 2019/0058307 A1    Feb. 21, 2019

Related U.S. Application Data

(63) Continuation of application No. 15/573,846, filed as application No. PCT/EP2016/062252 on May 31, 2016, now Pat. No. 10,128,636.

(30) Foreign Application Priority Data

Jun. 9, 2015  (EP) .................................... 15171099

(51) Int. Cl.
    *H01S 5/00*    (2006.01)
    *H01S 5/183*   (2006.01)
    *H01S 5/42*    (2006.01)

(52) U.S. Cl.
    CPC ...... *H01S 5/18308* (2013.01); *H01S 5/18305* (2013.01); *H01S 5/18311* (2013.01);
    (Continued)

(58) Field of Classification Search
    CPC ............. H01S 5/18313; H01S 5/18305; H01S 5/18333; H01S 5/423; H01S 5/18308; H01S 5/18311; H01S 2301/173
    See application file for complete search history.

(56) References Cited

U.S. PATENT DOCUMENTS 5,881,085 A * 3/1999 Jewell .................. G02B 3/00
                                                  257/79
6,959,025 B2  10/2005 Jikutani et al.
(Continued)

FOREIGN PATENT DOCUMENTS

EP    0905835 A1     3/1999
JP    2004356438 A   12/2004

OTHER PUBLICATIONS

Westbergh, P. "High Speed Vertical Cavity Surface Emitting Lasers for Short Reach Communication" Doctorial Thesis, Chalmers University of Technology, Goteborg, Sweden (2011).

*Primary Examiner* — Kinam Park
(74) *Attorney, Agent, or Firm* — Leydig, Voit & Mayer, Ltd.

(57) ABSTRACT

The disclosure relates to a Vertical Cavity Surface Emitting Laser (100) comprising a first electrical contact (105), a substrate (110), a first Distributed Bragg Reflector (115), an active layer (120), a second Distributed Bragg Reflector (130) and a second electrical contact (135). The Vertical Cavity Surface Emitting Laser comprises at least two current aperture layers (125) arranged below or above the active layer (120), wherein each of the current aperture layers (125) comprises one $Al_yGa_{(1-y)}As$-layer, wherein a first current aperture layer (125a) of the at least two current aperture layers (125) is arranged nearer to the active layer (120) as a second current aperture layer (125b) of the at least two current aperture layers (125), wherein the first current aperture layer (125a) comprises a first current aperture (122a) with a bigger size as a second current aperture (122b) of the second current aperture layer (125b). The disclosure also relates to a method of manufacturing such a VCSEL (100).

20 Claims, 9 Drawing Sheets

(52) U.S. Cl.
CPC ...... *H01S 5/18313* (2013.01); *H01S 5/18333* (2013.01); *H01S 5/423* (2013.01); *H01S 5/1833* (2013.01); *H01S 2301/166* (2013.01); *H01S 2301/173* (2013.01)

(56) References Cited

U.S. PATENT DOCUMENTS

| | | |
|---|---|---|
| 7,888,145 B2 | 2/2011 | Takaki et al. |
| 8,031,755 B2 | 10/2011 | Yoshikawa |
| 8,098,703 B2 | 1/2012 | Maeda et al. |
| 8,891,571 B2 | 11/2014 | Jikutani et al. |
| 10,128,636 B2 * | 11/2018 | Gerlach .............. H01S 5/18305 |
| 2004/0114654 A1 * | 6/2004 | Kaneko ................. B82Y 20/00 372/46.01 |
| 2005/0111507 A1 | 5/2005 | Ueki |
| 2007/0242716 A1 | 10/2007 | Samal et al. |
| 2008/0187015 A1 | 8/2008 | Yoshikawa et al. |
| 2008/0205463 A1 | 8/2008 | Takaki et al. |
| 2009/0135872 A1 | 5/2009 | Uchida |
| 2010/0226402 A1 * | 9/2010 | Maeda ................ H01S 5/18313 372/45.01 |
| 2013/0034117 A1 | 2/2013 | Hibbs-Brenner et al. |
| 2014/0348194 A1 * | 11/2014 | Park ..................... H01S 5/0218 372/44.01 |

\* cited by examiner

VERTICAL CAVITY SURFACE EMITTING LASER

CROSS-REFERENCE TO PRIOR APPLICATIONS

This application is a Continuation 35 U.S.C. § 111 of the U.S. application Ser. No. 15/573,846 which is the U.S. National Phase application under 35 U.S.C. § 371 of International Application No. PCT/EP2016/062252, filed on May 31, 2016, which claims the benefit of EP Patent Application No. EP 15171099.3, filed on Jun. 9, 2015. These applications are hereby incorporated by reference herein.

FIELD OF THE INVENTION

The invention relates to a Vertical Cavity Surface Emitting Laser (VCSEL), a laser device comprising such a VCSEL and a corresponding method of fabricating such a VCSEL.

BACKGROUND OF THE INVENTION

State-of-the-art Vertical Cavity Surface Emitting Lasers (VCSELs) have an oxidized high-Al containing layer to form a current aperture to confine carriers and photons. Mesa etching is needed to expose the aperture layer to the lateral oxidation process which has the side-effect that also other layers such as Distributed Bragg Reflector layers (DBRs) are exposed to the oxidation process. It is important that the parasitic oxidation rate of the DBR layers is slower than the aperture layer which limits the high-Al fraction in the DBRs to ~90% for practical use.

US 2010/0226402 A1 discloses a laser diode including a laminate configuration including a lower multilayer reflecting mirror, an active layer and an upper multilayer reflecting mirror in order from a substrate side, in which the laminate configuration includes a columnar mesa section including an upper part of the lower multilayer reflecting mirror, the active layer and the upper multilayer reflecting mirror, and the lower multilayer reflecting mirror includes a plurality of pairs of a low refractive index layer and a high refractive index layer, and a plurality of oxidation layers nonuniformly distributed in a direction rotating around a central axis of the mesa section in a region except for a central region of one or more of the low refractive index layers.

EP 0 905 835 A1 discloses an independently addressable, high density, vertical cavity surface emitting laser/LED structure formed by a lateral oxidation process. The aperture of the laser structure is formed by either lateral wet oxidation or by both selective layer intermixing and lateral wet oxidation from a semi-annular groove etched in the laser structure.

SUMMARY OF THE INVENTION

It is an object of the present invention to provide an improved VCSEL.

According to a first aspect a Vertical Cavity Surface Emitting Laser is provided. The Vertical Cavity Surface Emitting Laser comprises a first electrical contact, a substrate, a first Distributed Bragg Reflector, an active layer, a second Distributed Bragg Reflector and a second electrical contact. The Vertical Cavity Surface Emitting Laser comprises at least one $Al_yGa_{(1-y)}As$-layer with $0.95 \leq y \leq 1$ and with a thickness of at least 40 nm, wherein the $Al_yGa_{(1-y)}As$-layer is separated by means of at least one oxidation control layer.

The term "layer" does not exclude that the layer comprises two or more sub-layers. The VCSEL may comprise a current aperture layer for confining a driving current supplied by means of the first and the second electrical contact to a defined region of the active layer. The VCSEL may contain one, two, three, four or a multitude of $Al_yGa_{(1-y)}As$-layers. The $Al_yGa_{(1-y)}As$-layer or layers may be comprised by the DBR or, for example, the current aperture layer. The thickness of the $Al_yGa_{(1-y)}As$-layer maybe at least 40 nm, preferably at least 50 nm, more preferably at least 60 nm. The thickness of the $Al_yGa_{(1-y)}As$-layer may be most preferably in the range of a quarter of the emission wavelengths of the VCSEL when driven with a predefined electrical current. The aluminum content of the $Al_yGa_{(1-y)}As$-layer may be more than 95%, preferably more than 98%, more preferably more than 99% and most preferably 100 percent. The $Al_yGa_{(1-y)}As$-layer may be separated by means of one, two, three or more oxidation control layers. The number of oxidation control layers within the $Al_yGa_{(1-y)}As$-layer may be limited to four or five oxidation control layers especially if the thickness of the $Al_yGa_{(1-y)}As$-layer is in the range between 40 nm and a quarter of the emission wavelengths of the VCSEL. The oxidation control layer or layers are adapted to reduce an oxidation rate of the $Al_yGa_{(1-y)}As$-layer in comparison to an $Al_yGa_{(1-y)}As$-layer with the same aluminum content without oxidation control layer or layers.

The first or the second Distributed Bragg Reflector may preferably comprise the at least one $Al_yGa_{(1-y)}As$-layer. The $Al_yGa_{(1-y)}As$-layer or layers contribute in this case to the reflectivity of the DBR.

A material of the oxidation control layer may preferably comprise or consist of $Al_xGa_{(1-x)}As$ with $0 \leq x \leq 0.9$. The range of the aluminum content may preferably be between 0.2 and 0.7, more preferably between 0.4 and 0.6. Oxidation control layers of pure gallium arsenide may have the disadvantage that absorption increases above an emission wavelength of around 800 nm if relatively thick oxidation control layers are used. The effect is negligible in case of thin oxidation control layers (thickness of around 1 nm).

The Vertical Cavity Surface Emitting Laser comprises preferably at least one $Al_yGa_{(1-y)}As$-layer with an aluminum content y>0.99. The at least one $Al_yGa_{(1-y)}As$-layer is preferably separated by means of at least two oxidation control layers, more preferably exactly 2 to 5 oxidation control layers. The material of the oxidation control layer comprises preferably $Al_xGa_{(1-x)}As$ with $0.4 \leq x \leq 0.6$, more preferably with an aluminum content of around 50%. Each low refractive index layer of at least the first (bottom) DBR preferably comprises or consists of a $Al_yGa_{(1-y)}As$-layer with an aluminum content y>0.99 and comprising at least one oxidation control layers. It may be further advantageous that the second DBR and one or more current aperture layer comprises or consists of a $Al_yGa_{(1-y)}As$-layer with an aluminum content y>0.99 and comprising at least one oxidation control layers. The current aperture layer may have a thickness of half of the emission wavelengths or an integer multiple thereof.

The at least one oxidation control layer has a thickness between 0.7 nm and 3 nm, preferably between 0.8 nm and 2 nm, more preferably between 0.9 nm and 1.5 mm. The thickness of the at least one oxidation control layer (119, 125b) may comprise between 3% and 10% of a total thickness of the $Al_yGa_{(1-y)}As$-layer. The total thickness of the $Al_yGa_{(1-y)}As$-layer is determined by the entire thickness of all sub-layers of the $Al_yGa_{(1-y)}As$-layer which are separated by the oxidation control layer or layers and the thickness of the oxidation control layer or layers.

The current aperture layer may comprise the at least one $Al_yGa_{(1-y)}As$-layer. The current aperture layer may have a thickness of half of the emission wavelength of the VCSEL or an integer multiple thereof. The current aperture layer would in this case have no effect with respect to reflectivity of an adjacent DBR. Preferably, the current aperture layer may have thickness of a quarter of the emission wavelength of the VCSEL or an uneven multiple thereof such that the current aperture layer may contribute to the reflectivity of an adjacent DBR or may even be part of the DBR.

The Vertical Cavity Surface Emitting Laser comprises a first electrical contact, a substrate, a first Distributed Bragg Reflector, an active layer, a second Distributed Bragg Reflector and a second electrical contact. The Vertical Cavity Surface Emitting Laser may comprise at least two current aperture layers, wherein the current aperture layers are arranged below or above the active layer. Both of the at least two current aperture layers may be preferably be arranged below or above the active layer. Alternatively it may be possible that one of the at least two current aperture layers may be arranged below the active layer and the other one of the at least two current aperture layers may be preferably be arranged above the active layer. A first current aperture layer of the at least two current aperture layers may be arranged nearer to the active layer as a second current aperture layer of the at least two current aperture layers. Nearer means in this respect a nearer distance between the layers perpendicular to the layers. It may be preferred that the first current aperture layer of the at least two current aperture layers may be arranged between the active layer and the second current aperture layer of the at least two current aperture layers. The first current aperture layer may comprise a first current aperture with a bigger size as a second current aperture of the second current aperture layer. The size of the current apertures is given by the non-oxidized parts of the current aperture layers. The current aperture may have a circular shape such that the size of the current aperture can be defined by means of the diameter. The shape of the current aperture may alternatively be elliptical, rectangular, triangular and the like. The shape of the current aperture is mainly determined by the shape of the mesa of the VCSEL and the oxidation process. The current apertures comprise a common symmetry axis such that in case of circular current apertures the centers of the circles are arranged along this common symmetry axis. Each of the at least two current aperture layers may preferably comprise a $Al_yGa_{(1-y)}As$-layer with one or more oxidation control layer or layers. The thickness of the $Al_yGa_{(1-y)}As$-layers may be less than 40 nm, for example 30 nm or even 20 nm. The $Al_yGa_{(1-y)}As$-layers may simplify manufacturing or processing of current apertures with different sizes such that the size of the apertures can be manufactured in a precise way. Alternatively, oxidation of AlGaAs layers may be controlled by providing defined variations of the aluminum content within the AlGaAs layers (layers with graded aluminum content) or different Al concentrations of the AlGaAs layers. The at least two current aperture layers may in this case also comprise AlGaAs layers with an average aluminum concentration or aluminum concentration of less than 95%. The aluminum concentration within the AlGaAs layers needs to be controlled in a very precise way in order to enable sufficient control of the oxidation width of the different current aperture layers such that $Al_yGa_{(1-y)}As$-layers with oxidation control layers may be preferred. The first and the second current aperture layer are arranged such that during operation of the VCSEL high current densities at the edge of the first current aperture are avoided or at least limited such that high reliability and lifetime of the VCSEL is enabled. The first and the second current aperture layer may preferably be arranged in the layer arrangement of the first or the second DBR.

The first current aperture layer with the first current aperture may preferably be attached to the upper side or lower side of the active layer, or to phrase it differently, that near to the active layer such that a lateral spread of the charge carriers is avoided. The second current aperture layer with the second current aperture is arranged such that current densities at the edge of the first current aperture are less than 100 kA/cm$^2$ during operation of the VCSEL. Limitation of the current at the edge of the first current aperture (current peaking) increases reliability and lifetime of the VCSEL and may in addition avoid support of higher-order laser modes which may be unwanted especially for single mode VCSELs.

The second current aperture or more general the current aperture with the smallest size may preferably be arranged at a distance corresponding to an integer multiple of halve of the emission wavelength of the VCSEL, more preferably at a distance corresponding to an even multiple of halve of the emission wavelength of the VCSEL and most preferably at a distance of six times halve of the emission wavelength of the VCSEL to the active layer. The distance between the active layer which is a high refractive layer in comparison to the low refractive layers of the DBRs and the second current aperture is taken from a node of the standing wave pattern within the active layer (comprising supporting layers) at the side of the active layer next to the layer with the second current aperture and a node of the standing wave pattern within the second current aperture layer comprising the second current aperture. The oxidation profile of the current aperture with the smallest size may be tapered in order to avoid optical guiding.

The Vertical Cavity Surface Emitting Laser may preferably be manufactured according following method. The method comprises the steps of:
  providing a first electrical contact,
  providing a substrate,
  providing a first Distributed Bragg Reflector,
  providing an active layer,
  providing a second Distributed Bragg Reflector,
  providing a second electrical contact,
  providing at least two current aperture layers, wherein the at least two current aperture layers are arranged below or above the active layer,
  arranging a first current aperture layer of the at least two current aperture layers nearer to the active layer as a second current aperture layer of the at least two current aperture layers,
  providing a first current aperture in the first current aperture layer,
  providing a second current aperture in the second current aperture layer with a smaller size as the first current aperture.

The method steps need not necessarily be performed in the order given above. The substrate may, for example, be provided in a first step and the first electrical contact in a second step. Providing the first and the second current aperture may comprise the steps of providing the first and the second current aperture layer and oxidizing these layers in a subsequent step. The first and the second current aperture layers may be provided by alternately depositing sublayers and oxidation control layers as described above and below. Number of oxidation control layers and distance between the oxidation control layers may be used in order to control the oxidation width and thus the size of the current apertures. The first and the second current aperture layers may alternatively be provided by depositing layers with smoothly varying aluminum content or different aluminum concentration within layers as described above. The variation of their aluminum content or the aluminum content may be adapted in the layers to the intendant oxidation width of the current aperture layers.

The oxidation process may alternatively be performed by means of current aperture layers with the same aluminum content. The oxidation width of the different current apertures may be controlled by subsequently etching an oxidation opening to the respective oxidation control layer. It may also be possible to combine sequential etching of the current apertures with different aluminum content and/or oxidation control layers. The difference between the size of the first current aperture and the second current aperture is preferably between 1 μm and 6 μm in diameter taking a circular aperture as reference.

All preferred embodiments described above and in the following may also be comprised in a VCSEL comprising the at least first and second current aperture layers wherein the first current aperture has a bigger size.

The VCSEL may comprise three, four, five or more current aperture layers with current apertures. The size of a current aperture of at least one of the current aperture layers being arranged on the side of the first current aperture layer next to the active layer is smaller than the size of the first current aperture. The size of two or more of the current apertures may be the same. Alternatively, the size of all current apertures may be different, wherein the size of the current apertures decreases in a direction perpendicular to the active layer, wherein the first current aperture has the biggest size. The current aperture layers may be arranged equidistantly such that the distance between two adjacent current aperture layers perpendicular to the direction of the active layer is the same for all current aperture layers. Alternatively, it may be possible that the distance between the current aperture layers varies. The first or second DBR may, for example, comprise a first low refractive index layer comprising the first current aperture layer with the first current aperture. The fourth low refractive index layer may comprise the second current aperture layer the second current aperture and the fifth low refractive index layer may comprise the third current aperture layer with a third current aperture. The size of the second current aperture may be smaller than the size of the third current aperture.

The Vertical Cavity Surface Emitting Laser may comprise at least one $Al_yGa_{(1-y)}As$-layer or one, two, three or more $Al_yGa_{(1-y)}As$-layers which comprise a tapered oxidation profile. The at least one $Al_yGa_{(1-y)}As$-layer with the tapered oxidation profile may comprise preferably at least two oxidation control layers. The at least two oxidation control layers separate the at least one $Al_yGa_{(1-y)}As$-layer in at least three sub-layers and wherein at least one of the three sub-layers has a different thickness as the other sub-layers. The sub-layer with the different thickness is preferably thicker in comparison to the other sub-layers. The thicker sub-layer oxidizes faster as the adjacent sub-layer such that the tapered oxidation profile is built during the oxidation process. The tapered oxidation profile comprises a waistline meaning the smallest diameter within the $Al_yGa_{(1-y)}As$-layer which is not oxidized during the oxidation process. The waistline of the tapered oxidation profile is preferably arranged in a range of a node of a standing wave pattern of the Vertical Cavity Surface Emitting Laser when driven at a predefined electrical driving current. In the range of the node means that the waistline is arranged much nearer to the node than the maximum of the standing wave pattern. The distance between the node and the waistline is preferably less than 35 nm, more preferably less than 25 nm. Arranging the waistline of the tapered oxidation profile in range of the node of the standing wave pattern may have the advantage that strong guiding of the standing wave pattern within the thick $Al_yGa_{(1-y)}As$-layer is avoided or at least reduced. Such guiding is usually avoided or limited by using thin current aperture layers with a thickness of around 30 nm or less.

The first or the second Distributed Bragg Reflector may comprise multitude $Al_yGa_{(1-y)}As$-layers, wherein the $Al_yGa_{(1-y)}As$-layers are separated by means of at least one oxidation control layer. The $Al_yGa_{(1-y)}As$-layers may comprise a maximum of 3 oxidation control layers. The $Al_yGa_{(1-y)}As$-layers may be arranged to reduce the thermal resistance of the Vertical Cavity Surface Emitting Laser (100) to a cooling structure when mounted on the cooling structure. The DBR comprising the $Al_yGa_{(1-y)}As$-layers may be the top or bottom DBR depending on the arrangement of VCSEL and cooling structure. Most common arrangement will be the bottom DBR in case of a top emitting VCSEL. The high aluminum content of the $Al_yGa_{(1-y)}As$-layers result in a high thermal conductivity. The aluminum content may thus preferably be as high as possible, for example, hundred percent. The $Al_yGa_{(1-y)}As$-layers are in this case AlAs-layers.

The high aluminum content of the $Al_yGa_{(1-y)}As$-layers may further be used to reduce the parasitic capacitance of the VCSEL. The first or the second Distributed Bragg Reflector may thus comprise a multitude of $Al_yGa_{(1-y)}As$-layers. The $Al_yGa_{(1-y)}As$-layers are separated by means of at least one oxidation control layer and preferably a maximum of 3 oxidation control layers. The DBR comprising the $Al_yGa_{(1-y)}As$-layers may be the top or bottom DBR depending on the arrangement of VCSEL. Most common arrangement will be the top DBR in case of a top emitting VCSEL.

The first and the second Distributed Bragg Reflector comprise a multitude of high refractive index layers and a multitude of low refractive index layers, wherein the low refractive index layers comprise said $Al_yGa_{(1-y)}As$-layers or are said $Al_yGa_{(1-y)}As$-layers. The $Al_yGa_{(1-y)}As$-layers are separated by means of at least one oxidation control layer and preferably a maximum of 3 oxidation control layers.

According to a second aspect a laser device is provided. The laser device comprises at least one Vertical Cavity Surface Emitting Laser according to any embodiments described above and an electrical driving circuit for electrically driving the Vertical Cavity Surface Emitting Laser. The laser device optionally may further comprise an electrical power supply like, for example, a battery or rechargeable battery arrangement. The laser device may be coupled to an optical sensor device, optical datacom device or the like.

According to a third aspect a method of fabricating a Vertical Cavity Surface Emitting Laser is provided. The method comprises the steps of:
  providing a first electrical contact,
  providing a substrate,
  providing a first Distributed Bragg Reflector,
  providing an active layer,
  providing a second Distributed Bragg Reflector,
  providing a second electrical contact,
  providing at least one $Al_yGa_{(1-y)}As$-layer with $0.95 \leq y \leq 1$
    and with a thickness of at least 40 nm, wherein the $Al_yGa_{(1-y)}As$-layer is separated by means of at least one oxidation control layer.

The method steps need not necessarily be performed in the order given above. The substrate may, for example, be provided in a first step and the first electrical contact in a second step. The at least one $Al_yGa_{(1-y)}As$-layer may be provided within the step of providing the first and/or second DBR. The method may optionally comprise an additional step of providing a current aperture layer which may be the at least one $Al_yGa_{(1-y)}As$-layer. According to a fourth aspect a method of fabricating a laser device is provided. The method comprises the steps of:

providing a VCSEL as described above,
providing an electrical driving circuit, and optionally
providing an electrical power supply.

Further advantageous embodiments are defined below.

BRIEF DESCRIPTION OF THE DRAWINGS

These and other aspects of the invention will be apparent from and elucidated with reference to the embodiments described hereinafter.

The invention will now be described, by way of example, based on embodiments with reference to the accompanying drawings.

In the drawings.

DETAILED DESCRIPTION OF EMBODIMENTS

Various embodiments of the invention will now be described by means of the Figures.

Figure 1:
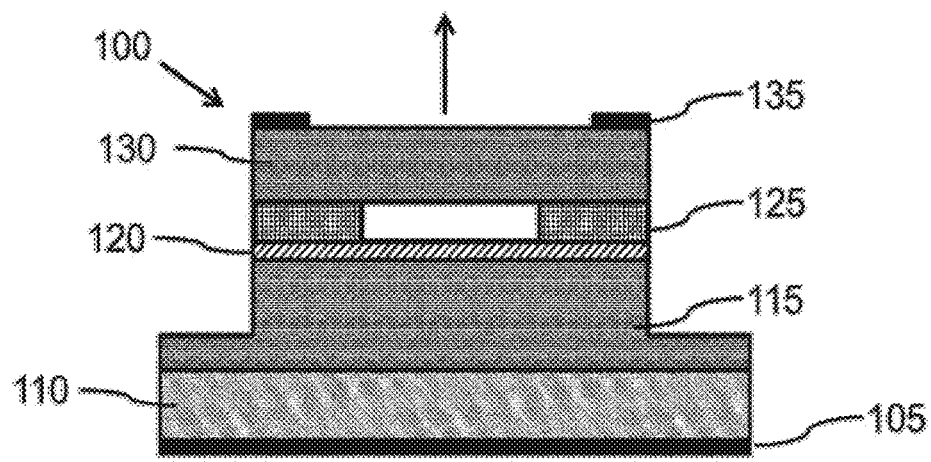
FIG. 1 shows a principal sketch of a first VCSEL

FIG. 1 shows a principal sketch of a first VCSEL 100. The first VCSEL 100 is a top emitting VCSEL 100 emitting laser light in a direction away from a substrate 110. On the bottom side of the substrate 110 a first electrical contact 105 is provided. On the top side of the substrate is a first DBR 115 provided comprising 30 pairs of layers with a first and a second refractive index. The pairs of layers of the first DBR 115 comprise AlGaAs layers with high and low aluminum content. The aluminum content may in extreme cases and depending on the emissions wavelength of the VCSEL 100 be 0% for the high refractive index material and up to 100% for the low refractive index material. The thickness of the layers is adapted to the emission wavelength of the VCSEL 100 (quarter wavelength thickness) in order to provide the requested reflectivity of more than 99.9%. On top of the first DBR 115 is an active layer 120 provided. The active layer 120 comprises a quantum well structure for light generation. An n-current injection layer (not shown) may be arranged between the first DBR 115 and the active layer 120. The VCSEL 100 further comprises a current aperture layer 125 comprising or consisting of an $Al_{0.98}Ga_{0.02}As$-layer with a thickness of around 70 nm which is in the range of a quarter of the emission wavelength of the VCSEL 100 of 850 nm. The $Al_{0.98}Ga_{0.02}As$-layer comprises five oxidation control layers 125b comprising or consisting of a $Al_{0.2}Ga_{0.8}As$-layer with a thickness of 1 nm. The second DBR 130 comprises 15 pairs of layers which comprise AlGaAs layers with high and low aluminum content similar or even identical to the AlGaAs layers of the first DBR. The thickness of the pair of layers is adapted to the emission wavelength of the VCSEL 100 in order to provide the requested reflectivity of around 95%. A ring shaped second electrical contact 135 is electrically contacted to the electrically conductive second DBR 130. The VCSEL 100 emits laser light in the direction of the arrow via the second DBR 130. The current aperture layer 125 is arranged above the active layer 120.

Figure 2:
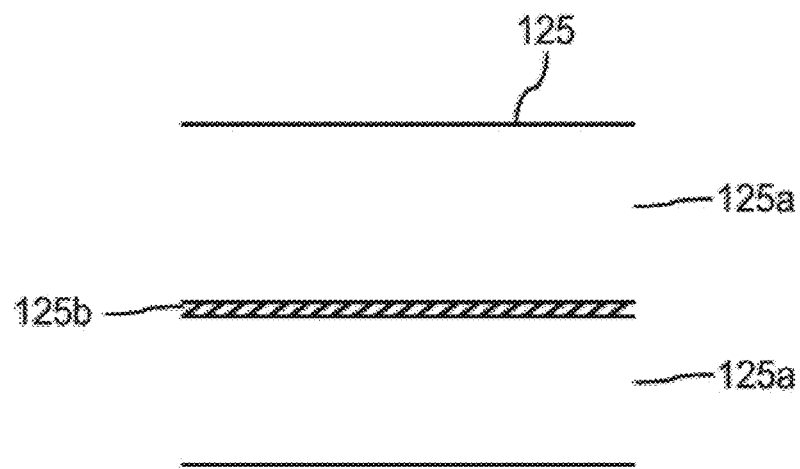
FIG. 2 shows a principal sketch of a current aperture layer

FIG. 2 shows a principal sketch of the current aperture layer 125 with two $Al_{0.98}Ga_{0.02}As$-sub-layers 125a which are separated by the oxidation control layer 125b. The thickness of the $Al_{0.98}Ga_{0.02}As$-sub-layers 125a is different in order to enable an oxidation profile within the current aperture layer 125. The oxidation control layer 125b enables improved control of the oxidation of the current aperture layer 125 during manufacturing of the VCSEL 100.

Figure 3:
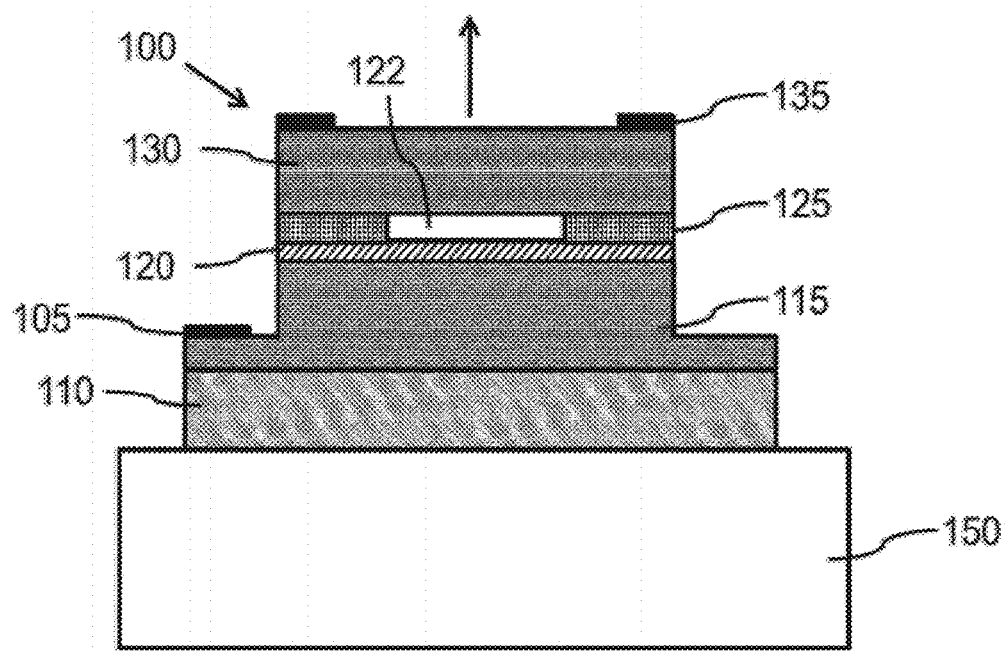
FIG. 3 shows a principal sketch of a second VCSEL

FIG. 3 shows a principal sketch of a second VCSEL 100. The second VCSEL 100 is a top emitting VCSEL 100 emitting laser light in a direction away from a substrate 110. On the top side of the substrate is a first DBR 115 provided. The active layer 120 is provided on top of the first DBR 115. The current aperture layer 125 with current aperture 122 is provided on top of the active layer 120. A second DBR 130 is provided on top of the current aperture layer 125. The current aperture layer 125 comprises of consists of AlAs. The thickness of the current aperture layer 125 which comprises two oxidation control layers 125b is 40 nm. A second electrical contact 135 is electrically contacted to the electrically conductive second DBR 130. The VCSEL 100 emits laser light in the direction of the arrow via the second DBR 130. The VCSEL 100 may comprise further layers as, for example, buffer layers which are not shown. The VCSEL 100 is mounted with the substrate 110 on a cooling structure 150. The first electrical contact 105 is arranged as an intracavity contact on a conductive layer arranged within the first DBR 115.

Figure 4:
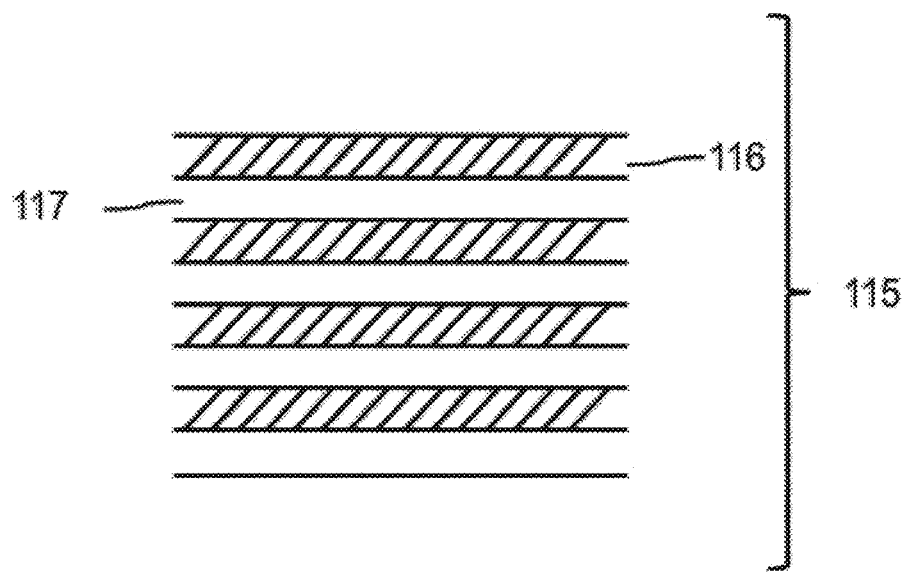
FIG. 4 shows a principal sketch of the first DBR of the second VCSEL
Figure 5:
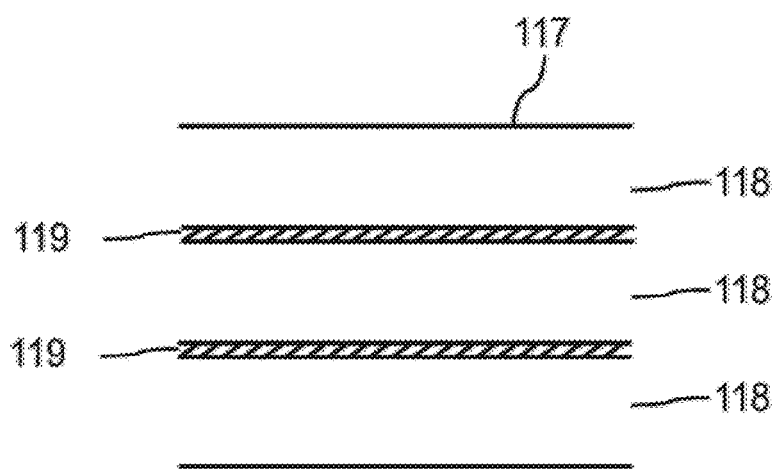
FIG. 5 shows a principal sketch of a low refractive index layer of the first DBR

FIG. 4 shows a principal sketch of the first DBR 115 of the second VCSEL 100. The first DBR 115 comprises alternating sequence of 40 high refractive index layers 116 and low refractive index layers 117. The high refractive index layer 116 comprises or consists of the $Al_{0.05}Ga_{0.95}As$ and low refractive index layer 117 comprises or consists of AlAs with two oxidation control layers 119 comprising or consisting of $Al_{0.5}Ga_{0.5}As$ with the thickness of 1 nm. FIG. 5 shows a principal sketch of a low refractive index layer 117 of the first DBR 115. The low refractive index layer 117 is separated by means of two oxidation control layers 119 such that the three AlAs-sub-layers 118 have the same thickness. The high thermal conductivity of the AlAs-layers reduces thermal resistance between the active layer 120 and the cooling structure 150. The oxidation control layers 119 enable improved control of the oxidation of the current aperture layer 125 during manufacturing of the VCSEL 100. The oxidation control layers 119 avoid faster oxidation of the low refractive index layers 117 in comparison to oxidation of the current aperture layer 125.

Figure 6:
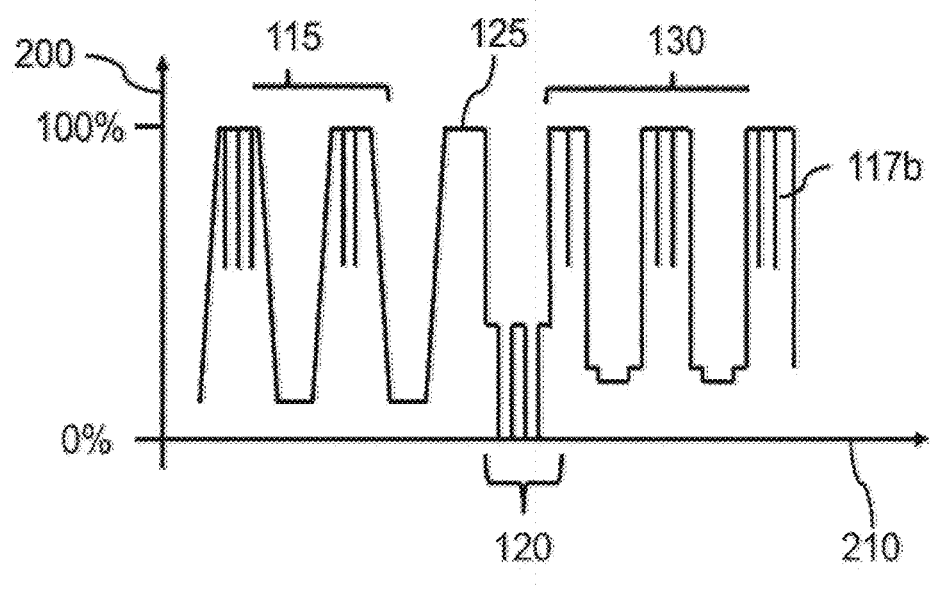
FIG. 6 shows a principal sketch of a layer structure of a third VCSEL

FIG. 6 shows a principal sketch of the layer structure of a third VCSEL 100. The layer structure is shown around the active layer 120. The vertical axis 200 shows the AlAs-content of the layers. Horizontal axis 210 shows the direction across VCSEL 100 along the emission direction with the first DBR 115 at the left and the second DBR 130 at the right. Four layers of the first DBR 115 are shown. The first low refractive index layer 117 at the left comprises or consists of AlAs with three oxidation control layers 119 comprising or consisting of $Al_{0.5}Ga_{0.5}As$. The second low refractive index layer 117 at the left comprises or consists of AlAs with two oxidation control layers 119 comprising or consisting of $Al_{0.5}Ga_{0.5}As$. The current aperture layer 125a rranged on the left of the active layer 120 comprises or consists of AlAs without any oxidation control layers. The current aperture layer 125 has a thickness of 30 nm. Four layers of the first DBR 115 are shown. The second low refractive index layer 117 at the right site active layer 120 comprises or consists of AlAs with one oxidation control layer 119 comprising or consisting of $Al_{0.5}Ga_{0.5}As$. The second and the third low refractive index layer 117 at the right side of the active layer 120 comprises or consists of AlAs with two oxidation control layers 119 comprising or consisting of $Al_{0.5}Ga_{0.5}As$. Oxidation control layers 119 have a thickness of 1 nm wherein the total thickness of the low refractive index layers 117 is around 70 nm.

Experiments have shown that an AlAs-layer with a thickness of 30 nm and without any oxidation control layer 119 arranged in a stack as shown in FIG. 6 oxidizes at 370° C. within around 72 minutes 38 μm. An AlAs-layer with a thickness of 70 nm which may be used as a low refractive index layer 117 within a DBR of a VCSEL with emission wavelengths of 850 nm oxidizes 45 μm under the same conditions. It is thus not possible to use such 70 nm AlAs-layer as low refractive index layer 117 in a DBR because oxidation is faster in comparison to oxidation of a 30 nm current aperture layer 125. In comparison 70 nm an AlAs-layer comprising one oxidation control layer 119 with a thickness of 1 nm and comprising or consisting of $Al_{0.5}Ga_{0.5}As$ oxidizes 28.6 nm, and a 70 nm AlAs-layer comprising two oxidation control layer 119 with a thickness of 1 nm and comprising or consisting of $Al_{0.5}Ga_{0.5}As$ oxidizes only 10 nm oxidized under the same conditions. The oxidation control layers 119 separate the AlAs-layer in the experiment in AlAs-sub-layer 118 of the same thickness. The oxidation control layers 119 enable to use pure AlAs as low refractive index layer 117. The oxidation control layers 119 enable depending on the number and positioning of oxidation control layers 119 a superior control of the oxidation width.

Figure 7:
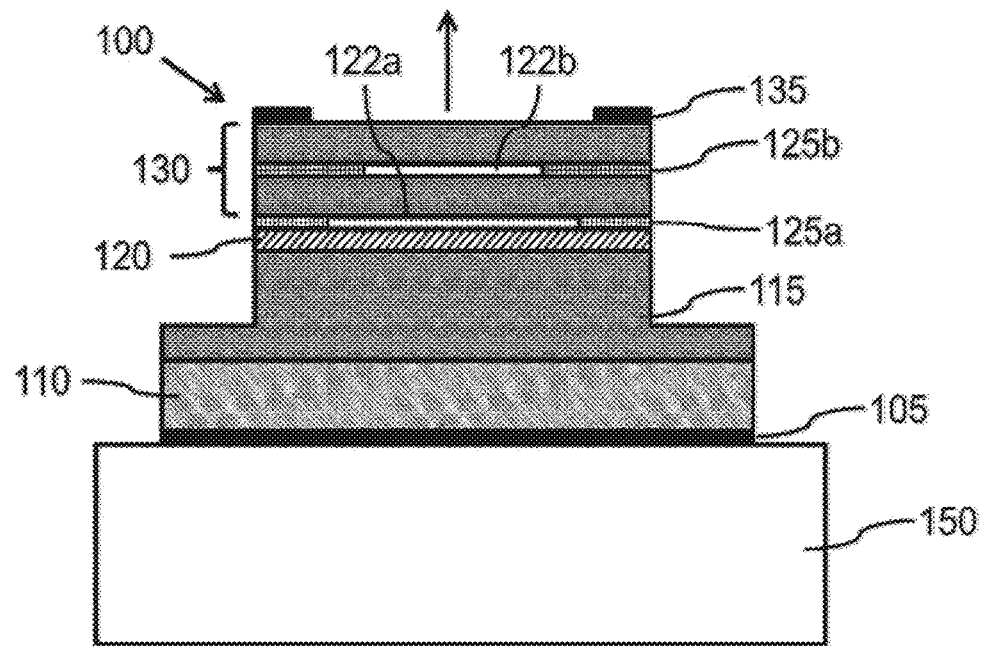
FIG. 7 shows a principal sketch of a layer structure of a fourth VCSEL

FIG. 7 shows a principal sketch of a layer structure of a fourth VCSEL 100. The fourth VCSEL100 is a top emitting VCSEL 100 emitting laser light in a direction away from substrate 110. On the bottom side of the substrate 110 a first electrical contact 105 is provided. On the top side of the substrate is a first DBR 115 provided comprising 30 pairs of layers with a first and a second refractive index. The pairs of layers of the first DBR 115 comprise AlGaAs layers with high and low aluminum content. The aluminum content may in extreme cases and depending on the emissions wavelength of the VCSEL 100 be 0% for the high refractive index material and up to 100% for the low refractive index material. The thickness of the layers is adapted to the emission wavelength of the VCSEL 100 (quarter wavelength thickness) in order to provide the requested reflectivity of more than 99.9%. On top of the first DBR 115 is an active layer 120 provided. The active layer 120 comprises a quantum well structure for light generation. An n-current injection layer (not shown) may be arranged between the first DBR 115 and the active layer 120. The VCSEL 100 further comprises a first current aperture layer 125a comprising or consisting of AlGaAs with an average composition of $Al_{0.90}Ga_{0.1}As$-layer with a thickness of around 30 nm. It may be preferred to have a higher aluminum content of at least 95% in order to enable high oxidation rates and therefore reduced oxidation times. The first current aperture layer 125a comprises a first current aperture 122a which is arranged on top the active layer 120 and is arranged on the upper surface of the active layer 120 in order to enable a good current confinement. The second DBR 130 comprises 15 pairs of layers which comprise AlGaAs layers with high and low aluminum content similar or even identical to the AlGaAs layers of the first DBR. The thickness of the pair of layers is adapted to the emission wavelength of the VCSEL100 in order to provide the requested reflectivity of around 95%. A second current aperture layer 125b is arranged within the layer stack of the first DBR. The second current aperture layer 125b is one of the low refractive index layers 117 of the first DBR and has a thickness of around 70 nm which corresponds to a quarter of the emission wavelengths of the VCSEL 100 of around 850 nm. The second current aperture layer 125b comprises a second current aperture 122b with a smaller diameter as the first current aperture 122a of the first current aperture layer 125a. The diameters of the first current aperture 122a and the second current aperture 122b and the distance between the first current aperture layer 125a and the second current aperture layer 125b perpendicular to the layers of the VCSEL 100 as well as the distance between the first current aperture layer 125a and the active layer are chosen such that a good current confinement is enabled but high current densities of, for example, more than 100 kA/cm² at the edge of the first current aperture 122a are avoided. Furthermore, the distance between the active layer 120 and the second current aperture 122b with the smallest aperture size is bigger in comparison to conventional VCSEL 100 such that low optical guiding is enabled. Usually, low optical guiding is preferred because it supports narrow beam divergence, higher single mode power, less spectral width VCSELs, high brightness designs, etc. Providing the current aperture layers 125 within the first or the second DBR may have the advantage that the current aperture layers 125 contribute to reflectivity of the first or the second DBR. In addition manufacturing of such current aperture layers 125 may be simplified because the aluminum profile matches the demands of DBR design. A ring shaped second electrical contact 135 is electrically contacted to the electrically conductive second DBR 130. The VCSEL 100 emits laser light in the direction of the arrow via the second DBR 130. The current aperture layers 125a re arranged above the active layer 120.

Figure 8:
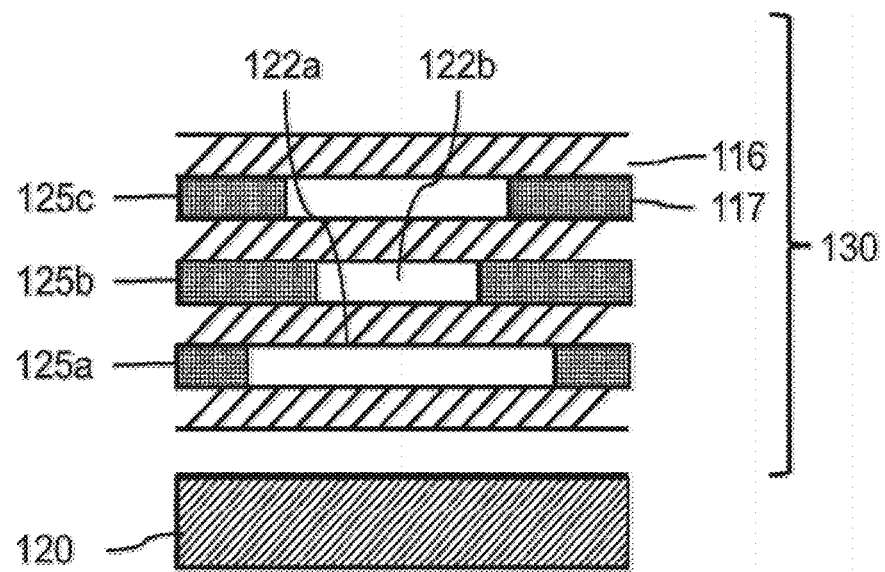
FIG. 8 shows a principal sketch of a layer structure of a fifth VCSEL

FIG. 8 shows a principal sketch of a part of a layer structure of a fifth VCSEL 100. The VCSEL 100 is a top emitting VCSEL 100. The second DBR 130 of which a part of the high refractive and low refractive index layers 116, 117 are shown is deposited on top of the active layer 120. The second DBR 130 comprises three low refractive index layers 117 which are arranged as current aperture layers 125. The first current aperture layer 125a is the second low refractive index layer 117 of the second DBR 130 in a direction away from active layer 120. The second current aperture layer 125b is the third low refractive index layer 117 and the third current aperture layer 125c is the fourth low refractive index layer 117 of the second DBR 130. The distance between the current aperture layers 125 is equal. The first current aperture 122a which is arranged next to the active layer 120 has the biggest size meaning in the case of a circular aperture the biggest diameter. The second current aperture 122b of the second current aperture layer 125b has the smallest size and is arranged between the first and the second current aperture layers 125a, 125c. The current aperture of the third current aperture layer 125c has a size which is in between of the sizes of the first current aperture 125a and the second current aperture 122b.

Figure 9:
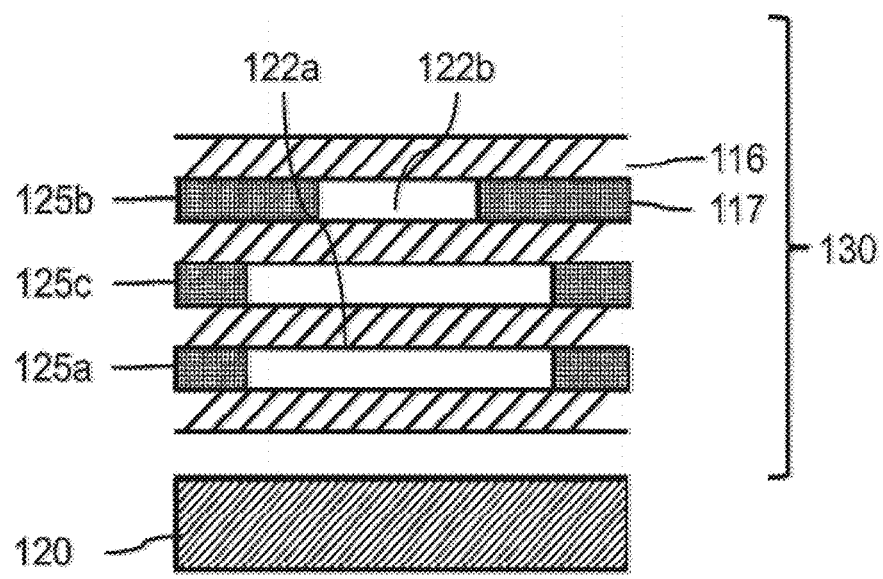
FIG. 9 shows a principal sketch of a layer structure of a sixth VCSEL

FIG. 9 shows a principal sketch of a part of a layer structure of a sixth VCSEL. The VCSEL 100 is a top emitting VCSEL 100. The second DBR 130 of which a part of the high refractive and low refractive index layers 116, 117 are shown is deposited on top of active layer 120. The second DBR 130 comprises three low refractive index layers 117 which are arranged as current aperture layers 125. The first current aperture layer 125a is the second low refractive index layer 117 of the second DBR 130 in a direction away from the active layer 120. The second current aperture layer 125b is the fourth low refractive index layer 117 and the third current aperture layer 125c is the third low refractive index layer 117 of the second DBR 130. The distance between the current aperture layers 125 is equal. The first current aperture 122a which is arranged next to the active layer 120 has the biggest size meaning in the case of a circular aperture the biggest diameter. The current aperture of the third current aperture layer 125c has the same size as the first current aperture 125a. The second current aperture 122b of the second current aperture layer 125b has the smallest size and is arranged above the first and the third current aperture layers 125a, 125c in the direction away from the active layer 120. The current apertures 125a, 125b and 125c may in an alternative embodiment be arranged in the first DBR 115 below the active layer 120.

Figure 10:
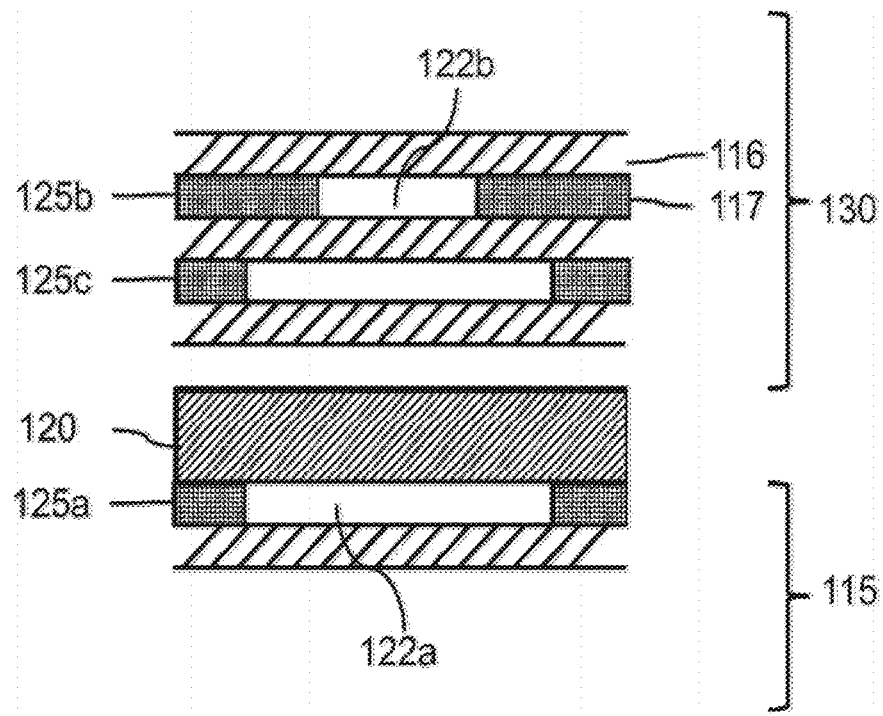
FIG. 10 shows a principal sketch of a layer structure of a seventh VCSEL

FIG. 10 shows a principal sketch of a layer structure of a seventh VCSEL. The layer structure is very similar to the layer structure of the sixth VCSEL shown in FIG. 9. The first current aperture layer 125a with the first current aperture 122a is in this case the first low refractive index layer 117 of the first DBR 115 below the active layer 120. The active layer 120 is arranged in this case between the first current aperture layer 125a and the second current aperture layer 125b which is arranged in the third low refractive index layer 117 of the second DBR 130.

Figure 11:
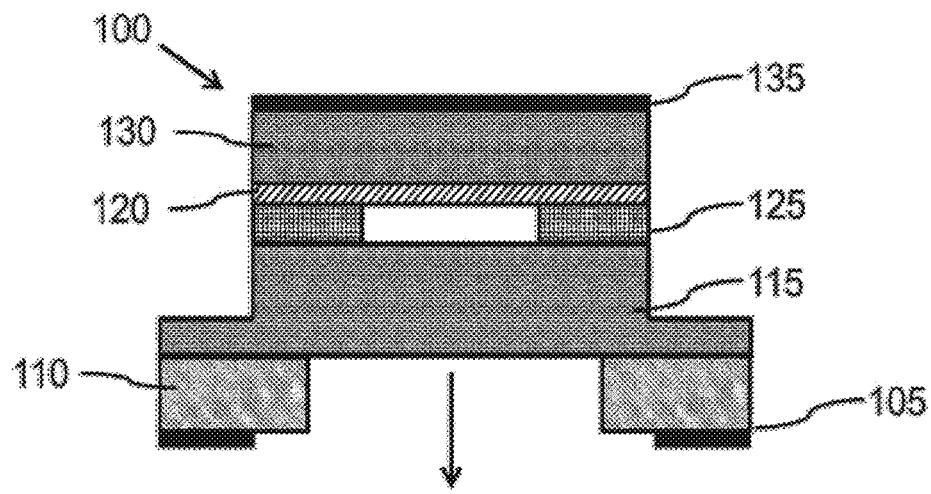
FIG. 11 shows a principal sketch of a eighth VCSEL

FIG. 11 shows a principal sketch of a eighth VCSEL 100. The seventh VCSEL 100 is a bottom emitting VCSEL 100 emitting laser light in a direction of a substrate 110. The substrate 110 is removed at the area at which the laser light is emitted. The direction of light emission is indicated by an arrow. On the bottom side of the substrate 110 a first electrical contact 105 is provided around the removed part of the substrate 110. On the top side of the substrate is a first DBR 115 provided with a reflectivity of around 95% in order to enable laser light emission via the first DBR 115. A current aperture layer 125 is provided on top of the first DBR 115. The active layer 120 is provided on top of the current aperture layer 125. A second DBR 130 is provided on top of the active layer 120 with a reflectivity of more than 99.9%. A second electrical contact 135 is electrically connected to the electrically conductive second DBR 130.

Figure 12:
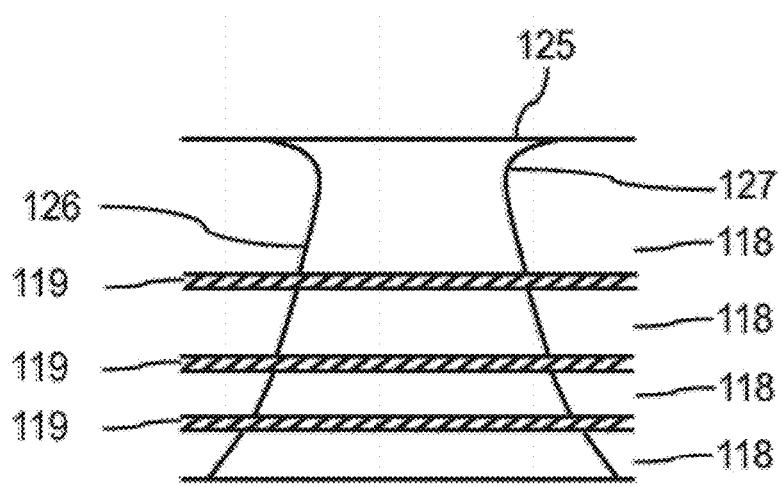
FIG. 12 shows a principal sketch of an oxidation profile
Figure 13:
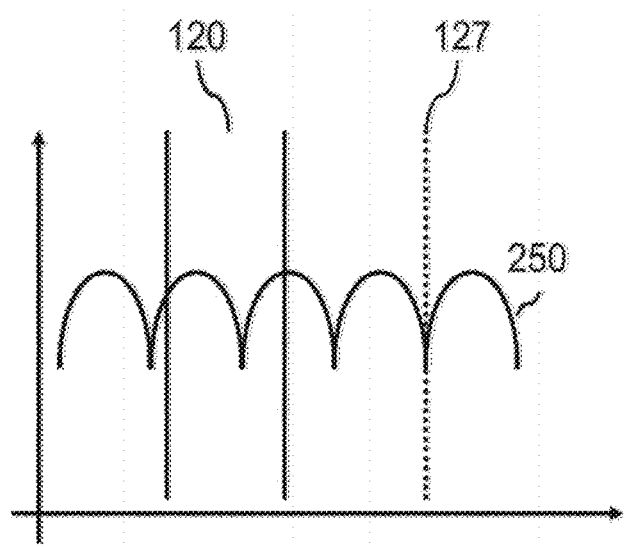
FIG. 13 shows a principal sketch of a standing wave pattern

FIG. 12 shows a principal sketch of an oxidation profile 126 with in the current aperture layer 125 of the seventh VCSEL 100. The current aperture layer 125 comprises four $Al_{0.99}Ga_{0.01}As$-sub-layers 125a which are separated by three the oxidation control layers 125b comprising or consisting of $Al_{0.7}Ga_{0.3}As$ with a thickness of 0.8 nm. The thickness of the $Al_{0.99}Ga_{0.02}As$-sub-layers 125a is different in order to enable an oxidation profile within the current aperture layer 125. The upper $Al_{0.99}Ga_{0.02}As$-sub-layer 125a next to the active layer 120 (see FIG. 7) has a thickness of around 35 nm, the next $Al_{0.99}Ga_{0.02}As$-sub-layer 125a below thickness of 20 nm, and the other two $Al_{0.99}Ga_{0.02}As$-sub-layers 125a have a thickness of 7 nm. The total thickness of the current aperture layer 125 is in the range of a quarter of the emission wavelength of 850 nm of the VCSEL 100 shown in FIG. 7. The oxidation control layer 125 therefore contributes to the reflection of first DBR 115. The different thickness of the $Al_{0.99}Ga_{0.02}As$-sub-layers 125a result in an oxidation profile 126 with a waistline 127 in the upper $Al_{0.99}Ga_{0.02}As$-sub-layer 125a near to the active layer 120. The waistline 127 is arranged in a range of a node of the standing wave pattern 250 of the VCSEL 100 when driven at a predefined current as depicted in FIG. 13. The oxidation control layers 125b separating the current aperture layer 125 in sub-layers of different thickness enables control of the oxidation of the current aperture layer 125 during manufacturing of the VCSEL 100 such that a defined oxidation profile is built. Alternative methods use, for example, a predetermined variation of the aluminum content across the current aperture layer 125. Experiments have shown that defined control of the aluminum content within the current aperture layer across the whole wafer or even several wafers is difficult during the manufacturing process and reduces production yield substantially. Therefore, thin current aperture layers with a thickness of 30 nm or less are used in conventional VCSEL in order to avoid strong guiding of the laser light.

Experiments with a AlAs current aperture layer 125 with a thickness of around 70 nm comprising two oxidation control layers 125a consisting of $Al_{0.5}Ga_{0.5}As$ with a thickness of 1 nm have been made. The upper AlAs sub-layer 125a was 2 nm thicker than the other two AlAs sub-layers 125a. The spectrum of the emitted laser light confirmed a tapered oxidation profile 126 within the current aperture layer 125 with a waistline 127 of the standing wave pattern.

Figure 14:
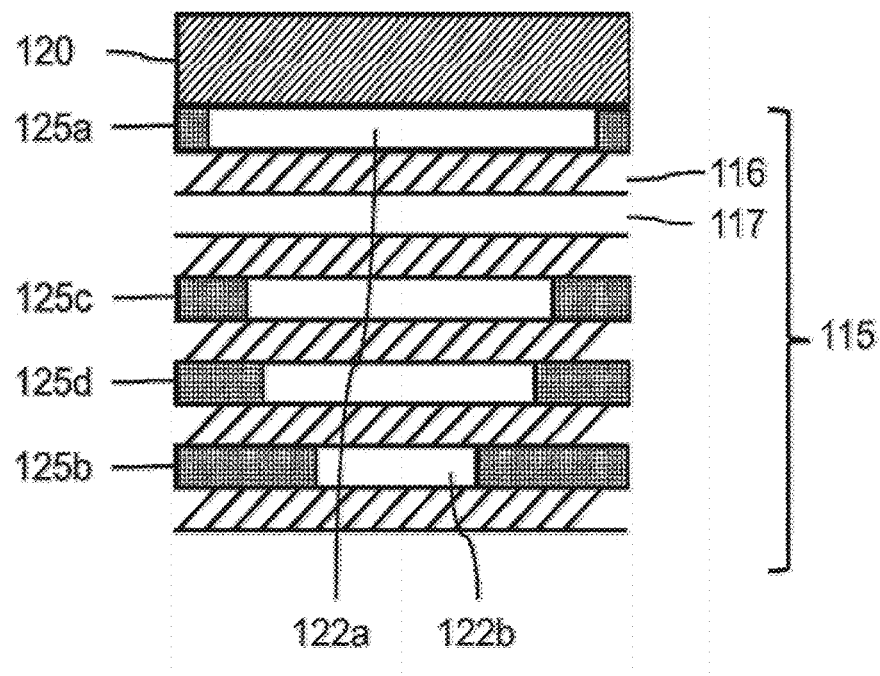
FIG. 14 shows a principal sketch of a layer structure of an ninth VCSEL

FIG. 14 shows a principal sketch of a part of a layer structure of an ninth VCSEL 100. The VCSEL 100 is in this case a bottom emitting VCSEL 100 similar as described in FIG. 10. Active layer 120 is deposited on top of the first DBR 115 of which a part of the low and high refractive layers 116, 117 are shown. The first DBR 115 comprises four low refractive index layers 117 which are arranged as current aperture layers 125. The first current aperture layer 125a is the uppermost low refractive index layer 117 of the first DBR 115 which is arranged directly below the active layer 120. The second current aperture layer 125b is the fifth low refractive index layer 117 starting with the first current aperture 125a layer as the first low refractive index layer 117. The third current aperture layer 125c is the third low refractive index layer 117 of the second DBR 130 and the fourth current aperture layer 125d if the fourth low refractive index layer 117 of the second DBR 130. The distance between the first current aperture layer 125a and the following current aperture layer (third current aperture layer 125c) is twice as big as the distance between the third, the fourth and the second current aperture layers 125c, 125d, 125b. The first current aperture 122a which is arranged next to the active layer 120 has the biggest size meaning the biggest area for passing electrical current. The subsequent current apertures in a direction away from the active layer subsequently decrease in size. The second current aperture 122b of the second current aperture layer 125b has the smallest size and is arranged below the first, the third and the fourth current aperture layers 125a, 125c in the direction away from the active layer 120.

FIG. 14 shows a principal sketch of laser device 300 comprising a multitude of VCSELs 100 with DBRs comprising low refractive index layers 117 consisting of Aluminum Arsenide (AlAs). The VCSELs 100 are arranged in a laser array 330. The configuration of a single VCSEL 100 is essentially the same as the configuration of the second VCSEL 100 shown in FIG. 3. The laser device 300 further comprises an electrical driving circuit 310 and an electrical power supply 320 which is a rechargeable battery. The electrical driving circuit 310 is arranged to supply electrical power provided by means of electrical power supply 320 in a defined way to laser array 330.

Figure 15:
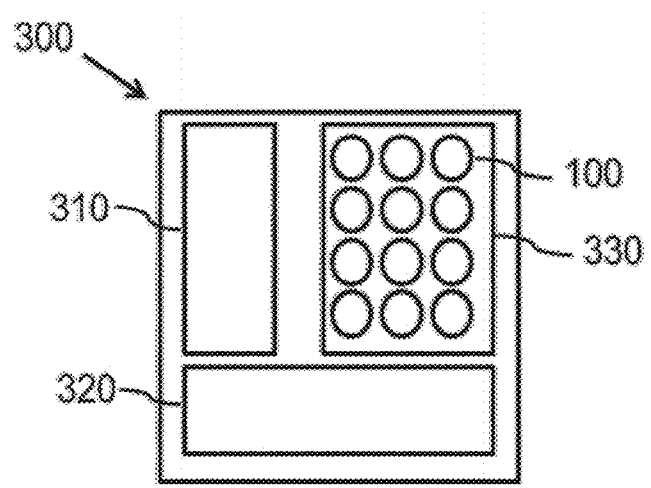
FIG. 15 shows a principal sketch of a laser device
Figure 16:
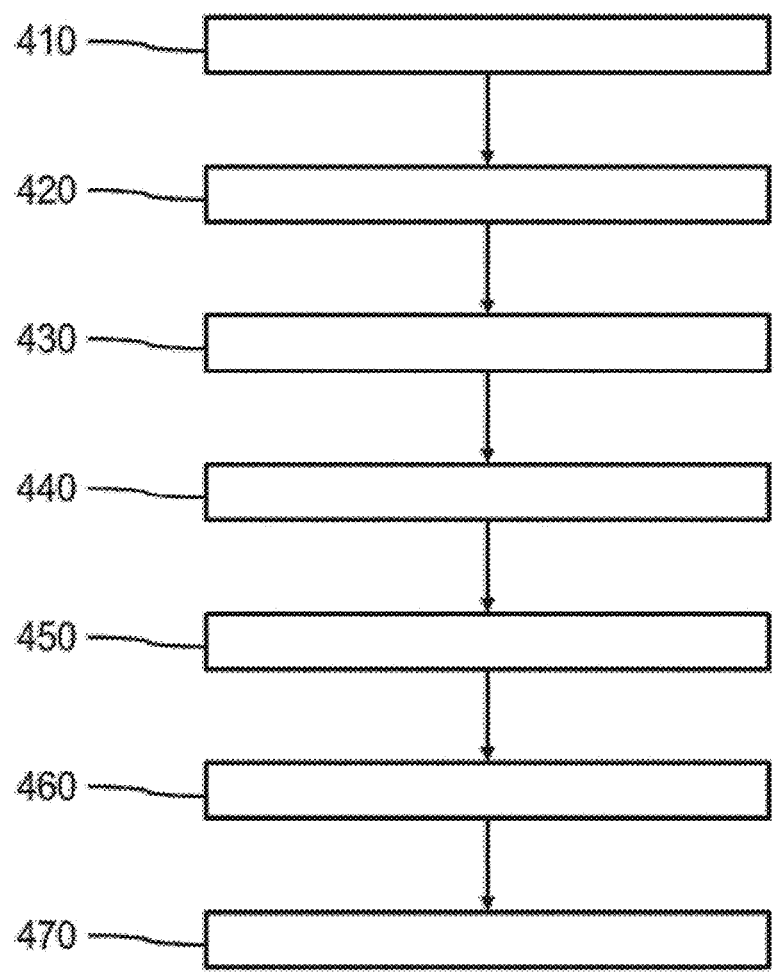
FIG. 16 shows a principal sketch of a process flow of a method of fabricating a VCSEL In the Figures, like numbers refer to like objects throughout. Objects in the Figures are not necessarily drawn to scale.

FIG. 15 shows a principal sketch of a process flow of a method of fabricating a VCSEL 100 according to the present invention. A first electrical contact is provided in step 410. The first electrical contact is attached to a bottom side of a GaAs substrate which is provided in step 420. A first DBR 115 is provided on a top side of the substrate in step 430 and an active layer 120 is provided in subsequent step 440 on top of the first DBR 115. On top of the active layer 120 is a second DBR provided in step 450. A second electrical contact is provided for electrically contacting the VCSEL100 step 460. At least one $Al_yGa_{(1-y)}As$-layer with $0.95 \leq y \leq 1$ and with a thickness of at least 40 nm is provided in step 470. The manufacturing step of providing the $Al_yGa_{(1-y)}As$-layer with $0.95 \leq y \leq 1$ comprises depositing a first $Al_yGa_{(1-y)}As$-sub-layer 118, 125a, depositing at least one oxidation control layer 119, 125b and depositing at least a second $Al_yGa_{(1-y)}As$-sub-layer 118, 125a on top of the at least one oxidation control layer 119, 125b. The method may further comprise the step of providing a current aperture layer 125.

The layers of the first DBR 115, the second DBR 130, the active layer 120, the current aperture layer 125 and any other layer as current injection layers, buffer layers and the like may be deposited by epitaxial methods like MOCVD.

It is the intention of the present invention to provide a VCSEL 100 which can be easily processed in a reliable way by enabling defined oxidation of 1, 2, 3 or more current aperture layers 125 and using $Al_yGa_{(1-y)}As$ with a minimum aluminum content of 95% as low refractive index layers 117. The invention enables to provide a defined oxidation profile within a thick (e.g. quarter wavelength) current aperture layer 125 which is adapted to interact with a standing wave pattern of the VCSEL 100 in an optimized way. The high aluminum content of the low refractive index layers 117 which may be used within one or both DBRs of the VCSEL 100 enables high thermal conductivity and reduced parasitic capacitance. Lifetime and switching behavior of the VCSEL 100 may be improved without reliability and yield problems which are usually caused by thick (quarter wavelength) $Al_yGa_{(1-y)}As$-layers with a minimum aluminum content of 95% and especially AlAs-layers because oxidation of such layers cannot sufficiently controlled across a waver during the manufacturing process.

While the invention has been illustrated and described in detail in the drawings and the foregoing description, such illustration and description are to be considered illustrative or exemplary and not restrictive.

From reading the present disclosure, other modifications will be apparent to persons skilled in the art. Such modifications may involve other features which are already known in the art and which may be used instead of or in addition to features already described herein.

Variations to the disclosed embodiments can be understood and effected by those skilled in the art, from a study of the drawings, the disclosure and the appended claims. In the claims, the word "comprising" does not exclude other elements or steps, and the indefinite article "a" or "an" does not exclude a plurality of elements or steps. The mere fact that certain measures are recited in mutually different dependent claims does not indicate that a combination of these measures cannot be used to advantage.

Any reference signs in the claims should not be construed as limiting the scope thereof.

LIST OF REFERENCE NUMERALS

100 Vertical Cavity surface Emitting Laser
105 first electrical contact
110 substrate
115 first distributed Bragg reflector
116 high refractive index layer
117 low refractive index layer
118 $Al_yGa_{(1-y)}As$-sub-layer
119 oxidation control layer
120 active layer
122 current aperture
122a first current aperture
122b second current aperture
125 current aperture layer
125a first current aperture layer
125b second current aperture layer
125c third current aperture layer
125d fourth current aperture layer
126 oxidation profile
127 waistline
130 second distributed Bragg reflector
135 second electrical contact
150 cooling structure
200 AlAs-content
210 direction across VCSEL along emission direction
250 standing wave pattern
300 laser device
310 electrical driving circuit
320 electrical power supply
330 laser array
410 step of providing a first electrical contact,
420 step of providing a substrate,
430 step of providing a first distributed Bragg reflector
440 step of providing an active layer
450 step of providing a second distributed Bragg reflector
460 step of providing a second electrical contact
470 step of providing $Al_yGa_{(1-y)}As$-layer

The invention claimed is:
1. A Vertical Cavity Surface Emitting Laser comprising:
a first electrical contact;
a substrate;
a first Distributed Bragg Reflector;
an active layer;
a second Distributed Bragg Reflector; and
a second electrical contact, wherein the Vertical Cavity Surface Emitting Laser comprises at least two current aperture layers arranged below or above the active layer, wherein each of the current aperture layers comprises a $Al_yGa_{(1-y)}As$-layer, wherein a first current aperture layer of the at least two current aperture layers has a first current aperture, wherein a second current aperture layer of the at least two current aperture layers has a second current aperture, wherein the first current aperture layer of the at least two current aperture layers is arranged nearer to the active layer than the second current aperture layer of the at least two current aperture layers, wherein the first current aperture is larger than the second current aperture.

2. The Vertical Cavity Surface Emitting Laser according to claim 1, further comprising at least one $Al_yGa_{(1-y)}As$-layer with $0.95 \leq y \leq 1$, wherein the at least one $Al_yGa_{(1-y)}As$-layer has a thickness of at least 40 nm, wherein the at least one $Al_yGa_{(1-y)}As$-layer is separated into at least two sub-layers, wherein at least one oxidation control layer is disposed between the at least two sub-layers.

3. The Vertical Cavity Surface Emitting Laser according to claim 2, wherein the at least one oxidation control layer has a by a thickness between 0.7 nm and 3 nm.

4. The Vertical Cavity Surface Emitting Laser according to claim 1, wherein each of the at least two current aperture layers comprises a $Al_yGa_{(1-y)}As$-layer with one or more oxidation control layers.

5. The Vertical Cavity Surface Emitting Laser according to claim 1, wherein the second current aperture is arranged at a distance corresponding to an integer multiple of half of the emission wavelength of the Vertical Cavity Surface Emitting Laser to the active layer.

6. The Vertical Cavity Surface Emitting Laser according to claim 1, wherein the first Distributed Bragg Reflector or the second Distributed Bragg Reflector comprises the at least one $Al_yGa_{(1-y)}As$-layer.

7. The Vertical Cavity Surface Emitting Laser according to claim 2, wherein a material of the oxidation control layer comprises $Al_xGa_{(1-x)}As$, wherein $0 \leq x \leq 0.9$.

8. The Vertical Cavity Surface Emitting Laser according to claim 2, wherein the at least one $Al_yGa_{(1-y)}As$-layer has $y>0.99$, and wherein the at least one $Al_yGa_{(1-y)}As$-layer is separated by at least two oxidation control layers, and a material of the oxidation control layer comprises $Al_xGa_{(1-x)}As$ with $0.4 \leq x \leq 0.6$.

9. The Vertical Cavity Surface Emitting Laser according to claim 2, wherein a thickness of the at least one oxidation control layer comprises between 3% and 10% of a total thickness of the $Al_yGa_{(1-y)}As$-layer.

10. The Vertical Cavity Surface Emitting Laser according to claim 1, wherein at least one of the at least one $Al_yGa_{(1-y)}As$-layer comprises a tapered oxidation profile, wherein the current second aperture comprises a tapered oxidation profile.

11. The Vertical Cavity Surface Emitting Laser according to claim 10, wherein the at least one $Al_yGa_{(1-y)}As$-layer with the tapered oxidation profile comprises at least two oxidation control layers, wherein the at least two oxidation control layers separate the at least one $Al_yGa_{(1-y)}As$-layer in at least three sub-layers, and wherein at least one of the three sub-layers has a different thickness as the other sub-layers.

12. The Vertical Cavity Surface Emitting Laser according to claim 10, wherein a waistline of the tapered oxidation profile is arranged in a range of a node of a standing wave pattern of the Vertical Cavity Surface Emitting Laser when driven at a predefined electrical driving current.

13. The Vertical Cavity Surface Emitting Laser according to claim 2, wherein the first Distributed Bragg Reflector and the second Distributed Bragg Reflector comprise a multitude of high refractive index layers and a multitude of low refractive index layers, wherein the low refractive index layers comprise said $Al_yGa_{(1-y)}As$-layers.

14. The laser device comprising at least one Vertical Cavity Surface Emitting Laser according to claim 1 and an electrical driving circuit for electrically driving the Vertical Cavity Surface Emitting Laser.

15. A method of fabricating a Vertical Cavity Surface Emitting Laser, the method comprising:

providing a first electrical contact;

providing a substrate;

providing a first distributed Bragg reflector;

providing an active layer;

providing a second distributed Bragg reflector;

providing a second electrical contact;

providing at least two current aperture layers, wherein the at least two current aperture layers are arranged below or above the active layer;

arranging a first current aperture layer of the at least two current aperture layers nearer to the active layer as a second current aperture layer the at least two current aperture layers;

providing a first current aperture in the first current aperture layer; and providing a second current aperture in the second current aperture layer with a smaller size as the first current aperture.

16. The method of fabricating a Vertical Cavity Surface Emitting Laser according to claim 15, wherein each of the current aperture layers comprises at least one $Al_yGa_{(1-y)}As$-layer.

17. The method of fabricating a Vertical Cavity Surface Emitting Laser according to claim 16, wherein the at least one $Al_yGa_{(1-y)}As$-layer has a thickness of at least 40 nm, wherein the at least one $Al_yGa_{(1-y)}As$-layer is separated into at least two sub-layers, wherein at least one oxidation control layer is disposed between the at least two sub-layers.

18. The method of fabricating a Vertical Cavity Surface Emitting Laser according to claim 17, wherein the at least one oxidation control layer has a by a thickness between 0.7 nm and 3 nm.

19. The method of fabricating a Vertical Cavity Surface Emitting Laser according to claim 16, wherein each of the first current aperture layer and the second current aperture layer comprises a $Al_yGa_{(1-Y)}$As-layer with one or more oxidation control layers.

20. The method of fabricating a Vertical Cavity Surface Emitting Laser according to claim 15,
wherein the second current aperture is arranged at a distance corresponding to an integer multiple of half of the emission wavelength of the Vertical Cavity Surface Emitting Laser to the active layer.

* * * * *